(12) United States Patent
Rapoport et al.

(10) Patent No.: US 9,939,511 B2
(45) Date of Patent: Apr. 10, 2018

(54) SURFACE PHOTOVOLTAGE CALIBRATION STANDARD

(71) Applicant: SunEdison Semiconductor Limited (UEN201334164H), Singapore (SG)

(72) Inventors: Igor Rapoport, Eugene, OR (US); Robert James Crepin, Creve Coeur, MO (US); Patrick Alan Taylor, West Linn, OR (US)

(73) Assignee: SunEdison Semiconductor Limited, St. Peters, MO (US)

( * ) Notice: Subject to any disclaimer, the term of this patent is extended or adjusted under 35 U.S.C. 154(b) by 0 days.

(21) Appl. No.: 15/514,545

(22) PCT Filed: Sep. 16, 2015

(86) PCT No.: PCT/US2015/050473
§ 371 (c)(1),
(2) Date: Mar. 27, 2017

(87) PCT Pub. No.: WO2016/053629
PCT Pub. Date: Apr. 7, 2016

(65) Prior Publication Data
US 2017/0234960 A1  Aug. 17, 2017

Related U.S. Application Data

(60) Provisional application No. 62/059,436, filed on Oct. 3, 2014.

(51) Int. Cl.
*H01L 21/66* (2006.01)
*H01L 21/322* (2006.01)
(Continued)

(52) U.S. Cl.
CPC ....... *G01R 35/007* (2013.01); *G01R 31/2648* (2013.01); *H01L 21/266* (2013.01);
(Continued)

(58) Field of Classification Search
CPC ..... H01L 22/12; H01L 22/14; H01L 21/3221; H01L 21/324; G01R 31/2648; G01R 31/2831; G01R 35/007
See application file for complete search history.

(56) References Cited

U.S. PATENT DOCUMENTS

| | | | | |
|---|---|---|---|---|
| 4,181,538 A | * | 1/1980 | Narayan | ............ H01L 21/2636 136/261 |
| 4,598,249 A | * | 7/1986 | Goodman | ............... H02S 50/10 324/750.03 |

(Continued)

OTHER PUBLICATIONS

International Search Report and Written Opinion of the International Searching Authority regarding PCT/US2015/050473 dated Dec. 4, 2015; pp. 1-12.

(Continued)

*Primary Examiner* — David Zarneke
(74) *Attorney, Agent, or Firm* — Armstrong Teasdale LLP

(57) ABSTRACT

A method of preparing an iron-implanted semiconductor wafer for use in surface photovoltage iron mapping and other evaluation techniques. A semiconductor wafer is implanted with iron through the at least two different regions of the front surface of the semiconductor at different iron implantation densities, and the iron-implanted semiconductor wafer is annealed at a temperature and duration sufficient to diffuse implanted iron into the bulk region of the semiconductor wafer.

36 Claims, 5 Drawing Sheets

(51) Int. Cl.
*H01L 21/324* (2006.01)
*G01R 31/26* (2014.01)
*G01R 31/28* (2006.01)
*G01R 35/00* (2006.01)
*H01L 21/265* (2006.01)
*H01L 29/167* (2006.01)
*H01L 29/36* (2006.01)
*H01L 21/266* (2006.01)
*H01L 29/207* (2006.01)

(52) U.S. Cl.
CPC .... *H01L 21/2654* (2013.01); *H01L 21/26506* (2013.01); *H01L 21/324* (2013.01); *H01L 29/167* (2013.01); *H01L 29/207* (2013.01); *H01L 29/36* (2013.01); *G01R 31/2831* (2013.01); *H01L 21/3221* (2013.01); *H01L 22/12* (2013.01); *H01L 22/14* (2013.01)

(56) References Cited

U.S. PATENT DOCUMENTS

| | | | | |
|---|---|---|---|---|
| 5,804,981 A | * | 9/1998 | Lowell | H01L 22/20 257/E21.525 |
| 7,141,992 B2 | * | 11/2006 | Ohno | H01L 22/14 257/E21.531 |
| 7,432,150 B2 | * | 10/2008 | Durlam | H01L 43/12 257/E21.248 |
| 2003/0064533 A1 | | 4/2003 | Ramappa et al. | |
| 2006/0066324 A1 | | 3/2006 | Ohno et al. | |
| 2011/0139229 A1 | * | 6/2011 | Rohatgi | H01L 21/263 136/255 |
| 2015/0372125 A1 | * | 12/2015 | Kotani | H01L 29/7787 257/194 |
| 2016/0005623 A1 | * | 1/2016 | Shams-Kolahi | B01J 19/12 438/473 |

OTHER PUBLICATIONS

Rapoport, I. et al., "Iron Diffusion Profile Studies by Surface Photo-Voltage for Silicon Iron Implanted Wafers After Rapid Thermal Anneal", ECS Transactions, Jan. 1, 2007, pp. 33-41, vol. 2, No. 10.

Rapoport, I. et al., "Two-side surface photovoltage studies for implanted iron diffusion in silicon during rapid thermal anneal", Journal of Applied Physics, American Institute of Physics, Jan. 14, 2010, pp. 13518-1-13518-6,, vol. 107, No. 1.

* cited by examiner

SURFACE PHOTOVOLTAGE CALIBRATION STANDARD

CROSS-REFERENCE TO RELATED APPLICATION

This application is a National Stage application of International Application No. PCT/US2015/050473, filed on Sep. 16, 2015. International Application No. PCT/US2015/050473 claims priority to U.S. provisional patent application Ser. No. 62/059,436 filed on Oct. 3, 2014. The disclosure of both priority documents are hereby incorporated by reference as if set forth in their entirety.

FIELD OF THE INVENTION

The present invention generally relates to a method of preparing an iron-implanted semiconductor wafer for use as a calibration standard in wafer evaluation techniques.

BACKGROUND OF THE INVENTION

Iron contamination is known as a yield limiting factor during silicon device manufacturing. Thermal oxide iron contamination leads to oxide degradation and decreases the oxide breakdown voltage. Once diffused into the silicon bulk, iron creates deep-level recombination centers, reducing the carrier lifetime and causing device malfunctions. See A. A. Isratov, H. Hieslmair, and E. R. Weber, Appl. Phys. A: Mater. Sci. Process. 70, 489 (2000); and A. A. Isratov, H. Hieslmair, and E. R. Weber, Appl. Phys. A: Mater. Sci. Process. 69, 13 (1999).

Iron contamination during thermal processing originates from two major sources: iron diffusion from the wafer surface contaminated before thermal processes and iron cross contamination from the hardware components during thermal processing. See I. Rapoport, P. Taylor, B. Orschel, and J. Kearns, AIP Conf. Proc. 772, 103 (2005). High-resolution surface photovoltage (SPV) iron mapping is frequently employed to track the metal contamination sources. See G. Zoth and W. Bergholz, J. Appl. Phys. 67, 1 (1990); and A. Cacciato, S. Vleeshouwers, and S. Evseev, J. Electrochem. Soc. 145, 701 (1998).

SPV method accuracy improvements were implemented developing the Digital SPV method to enable the Fe detection limit within the $10^8$ atom/cm$^3$ range. See M. Wilson, A. Savtchouk, I. Tarasov, J. D'Amico, P. Edelman, N. Kochey and J. Lagowski, ECS Trans. 2008 16(6): 285-301

As thermal budgets are continually reduced for device processing, iron contaminants accumulate close to the wafer surface where the iron is initially introduced. Measuring the Two-Side SPV is an effective means for monitoring iron contamination after thermal processing. See I. Rapoport, P. Taylor, J. Kearns, and D. K. Schroder, J. Appl. Phys. 107, 013518 (2010).

SUMMARY OF THE INVENTION

Among the provisions of the present invention may be noted a method of preparing an iron-implanted semiconductor wafer for use in surface photovoltage iron mapping. The method comprises implanting iron through at least two different regions of a front surface of the semiconductor wafer, wherein the semiconductor wafer comprises the front surface, the back surface, a circumferential edge connecting the front and back surfaces, and a bulk region between the front surface and the back surface of the semiconductor wafer, and further wherein the iron is implanted through the at least two different regions of the front surface of the semiconductor at different iron implantation densities; and annealing the iron-implanted semiconductor wafer at a temperature and duration sufficient to diffuse implanted iron into the bulk region of the semiconductor wafer.

Other objects and features will be in part apparent and in part pointed out hereinafter.

DETAILED DESCRIPTION OF THE EMBODIMENT(S) OF THE INVENTION

Figure 1:
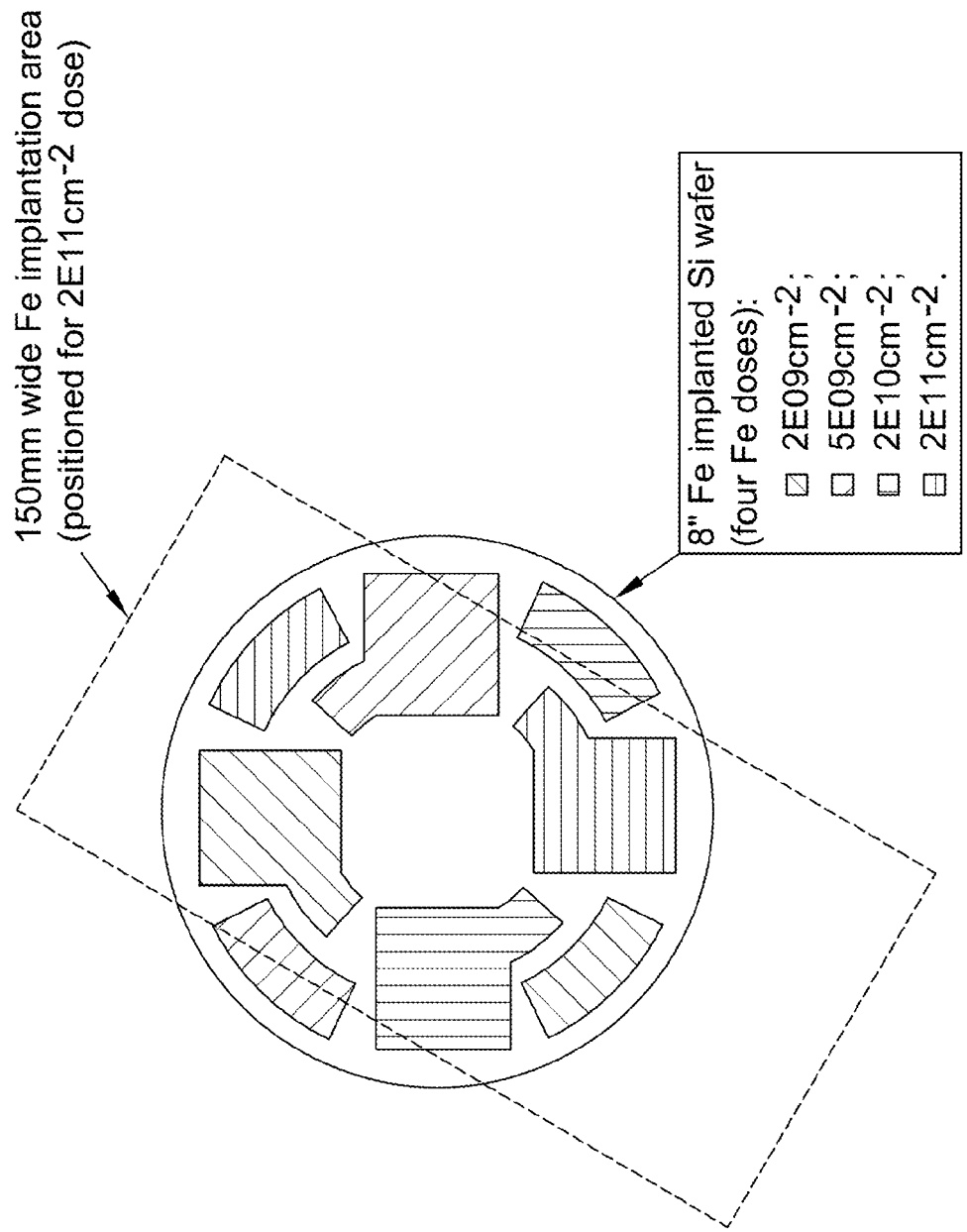
FIG. 1 is a depiction of a masking pattern and iron implantation densities in a silicon wafer prepared according to the method of the present invention.

The present invention is directed to a method of preparing a semiconductor wafer for use in surface photovoltage iron mapping and other evaluation techniques. The method of the present invention enables calibration standard design for measuring iron contaminant on a single wafer. By utilizing a mask and iron implantation at different iron implantation densities, wafer properties can be measured by a wide variety of evaluation techniques, including surface photovoltage (SPV), measuring lifetime measure via microwave photoconductance decay (μ-PCD), measuring electrically active defects via deep-level transient spectroscopy (DLTS), and measuring metallic contamination via Total-reflection X-ray fluorescence (TXRF) spectroscopy, among other techniques.

The substrates for use in the present invention include a semiconductor wafer, e.g., a single crystal semiconductor wafer or a polycrystalline semiconductor wafer. In general, the semiconductor wafer comprises two major, generally parallel surfaces. One of the parallel surfaces is a front surface of the substrate, and the other parallel surface is a back surface of the substrate. The substrates comprise a circumferential edge joining the front and back surfaces, and a central plane between the front and back surfaces. The substrates further comprise a bulk region between the front and back surfaces.

Prior to any operation as described herein, the front surface and the back surface of the substrate may be substantially identical. A surface is referred to as a "front surface" or a "back surface" merely for convenience and generally to distinguish the surface upon which the operations of method of the present invention are performed.

In preferred embodiments, the semiconductor wafers comprise a material selected from the group consisting of silicon, silicon carbide, silicon germanium, silicon nitride, silicon dioxide, gallium arsenide, gallium nitride, indium phosphide, indium gallium arsenide, germanium, and combinations thereof. The semiconductor wafers of the present invention typically have a nominal diameter of at least about 100 mm, at least about 200 mm, at least about 300 mm, at least about 450 mm, or more. The semiconductor wafer thicknesses may vary from about 250 micrometers to about 3500 micrometers, suitably within the range of about 500 micrometers to about 1000 micrometers.

In particularly preferred embodiments, the single crystal semiconductor wafers comprise single crystal silicon wafers which have been sliced from a single crystal ingot grown in accordance with conventional Czochralski crystal growing methods or float zone growing methods. Such methods, as well as standard silicon slicing, lapping, etching, and polishing techniques are disclosed, for example, in F. Shimura, Semiconductor Silicon Crystal Technology, Academic Press, 1989, and Silicon Chemical Etching, (J. Grabmaier ed.) Springer-Verlag, N.Y., 1982 (incorporated herein by reference). Preferably, the wafers are polished and cleaned by standard methods known to those skilled in the art. See, for example, W. C. O'Mara et al., *Handbook of Semiconductor Silicon Technology*, Noyes Publications. If desired, the wafers can be cleaned, for example, in a standard SC1/SC2 solutions. In some embodiments, the single crystal silicon wafers of the present invention are single crystal silicon wafers which have been sliced from a single crystal ingot grown in accordance with conventional Czochralski ("Cz") crystal growing methods, typically having a nominal diameter of at least about 100 mm, at least about 200 mm, at least about 300 mm, at least about 450 mm, or more. Wafer thickness may vary from about 250 micrometers to about 3500 micrometers, suitably within the range of about 500 micrometers to about 1000 micrometers. In some specific embodiments, the wafer thickness may be about 725 micrometers.

In some embodiments, the semiconductor wafer comprises a multicrystalline silicon wafer, e.g., of the type used in the photovoltaic industry. Multicrystalline silicon wafers comprise a randomly oriented and relatively uniform microstructure of silicon grains, e.g., on the order of about 100 micrometers or less, such as less than about 10 micrometers.

In some embodiments, the semiconductor wafer comprises a silicon on insulator wafer or a silicon germanium on insulator wafer. The standard silicon-on-insulator (SOI) structure is a thin layer of silicon (usually called top silicon or top Si) or silicon germanium isolated from the main body of the silicon substrate (usually called handle) by a layer of electrical insulator (usually silicon dioxide, $SiO_2$; it is also called BOX). Electronic devices, e.g. transistors, are usually formed in the top Si layer. SOI structures may be formed by directed bonding or by oxide-to-oxide bonding.

In some embodiments, the semiconductor wafer comprises a silicon wafer comprising a front surface layer formed by epitaxial deposition. Epitaxial deposition involves the deposition of a crystalline overlayer on a crystalline substrate. An epitaxial film may be the same or different than the underlying substrate. A homoepitaxial film is one in which a crystalline film is grown on a substrate or film of the same material. This technology is used to grow a film which is more pure than the substrate and to fabricate layers having different doping levels. A heteroepitaxial film differs from the underlying substrate. In heteroepitaxy, a crystalline film grows on a crystalline substrate or film of a different material.

In some embodiments, the single crystal semiconductor wafer comprises interstitial oxygen in concentrations that are generally achieved by the Czochralski-growth method. In some embodiments, the semiconductor wafer comprises oxygen in a concentration between about 4 PPMA and about 18 PPMA. In some embodiments, the semiconductor wafer comprises oxygen in a concentration between about 10 PPMA and about 35 PPMA. Interstitial oxygen may be measured according to SEMI MF 1188-1105.

In some embodiments, the semiconductor wafer comprises an electrically active dopant. Doped wafers may comprise any electrically active dopant selected from the group consisting of boron, aluminum, phosphorus, arsenic, and antimony. The dopant may be selected according to the intended use of the wafer, as is known in the art, and the concentration of the dopant may be within any range known in the art. Dopant concentrations may range from intrinsic silicon (not doped) to about 1000 PPMA ($5 \times 10^{19}$ atoms/$cm^3$). Doped wafers may comprise from about 0.001 PPMA ($5 \times 10^{13}$ atoms/$cm^3$) dopant concentration to about 1000 PPMA ($5 \times 10^{19}$ atoms/$cm^3$) dopant concentration. The resistivity of the wafer may vary from about 0.001 ohm cm to over 10,000 ohm cm.

In some embodiments, the semiconductor wafer comprises an oxide layer on the front surface thereof. An oxide layer may be formed on the front surface of the semiconductor wafer by a thermal oxidation step, as is known in the art. A wafer may be thermally oxidized in a furnace such as an ASM A400. The temperature may range from 650° C. to 1100° C. in an oxidizing ambient. The oxidizing ambient atmosphere can be a mixture of inert gas, such as Ar or $N_2$, and $O_2$. The oxygen content may vary from 1 to 10 percent, or higher. In some embodiments, the oxidizing ambient atmosphere may be up to 100% (a "dry oxidation"). In some embodiments, the ambient atmosphere may comprise a mixture of inert gas, such as Ar or $N_2$, and oxidizing gases, such as $O_2$ and water vapor (a "wet oxidation"). In an exemplary embodiment, wafers may be loaded into a vertical furnace, such as an A400. The temperature is ramped to the oxidizing temperature with a mixture of $N_2$ and $O_2$. At the desired temperature, water vapor is introduced into the gas flow. After the desired oxide thickness has been obtained, the water vapor and $O_2$ are turned off and the furnace temperature is reduced and wafers are unloaded from the furnace. In some embodiments, the oxide layer having a thickness between about 1 nanometer to about 1000 nanometers.

In some embodiments, a silicon nitride ($Si_3N_4$) layer is formed on the front surface of the wafer in order to avoid mobile ions in-diffusion to the oxide layer. A silicon nitride film may be deposited by means known in the art, for example by low pressure chemical vapor deposition (LP-CVD) or plasma-enhanced chemical vapor deposition (PECVD). LPCVD is a process used in the manufacturing of the deposition of thin films on semiconductors usually ranging from a few nanometers to many micrometers. PECVD may be used to deposit $SiO_2$, $Si_3N_4$ ($Si_xN_y$), $Si_xO_yN_z$ and amorphous Si films on the front surface of the semiconductor wafer. Alternatively, an aluminum oxide ($Al_2O_3$) layer may be formed on the front surface of the wafer.

In some preferred embodiments, the front surface of the semiconductor wafer is polished and cleaned prior to iron implantation, for example by the SC-1/SC-2 process. In some embodiments, both the front surface and the back surface of the semiconductor wafer is polished. In some embodiments, the wafer is unpolished, which may help reduce initial metals contamination derived from the polishing process.

According to some embodiments, the present invention is directed to a method of preparing an iron-implanted semiconductor wafer for use in surface photovoltage iron mapping. The method comprises implanting iron through at least two different regions of a front surface of the semiconductor wafer. The regions are defined by a photoresist mask that is impervious to the iron implantation technique. The ion implantation is made through the photoresist mask formed using the conventional contact of projection photolithography process, including the photoresist coat, photolithography mask introduction, photoresist exposure, photoresist hardening and etch. Mechanical masks also could be used for the local Ion Implantation. Suitable mechanical masks include a stainless mask, an aluminum mask, a glass mask, a silicon mask, or any other suitable mask as is known in the art. In some embodiments, the mask may be coated to reduce mechanical damage to the wafer when the mask is placed and to protect the wafer from mechanical damage and/or reduce metals cross-contamination. Applicable masks coating could be as Teflon, or Polymer, or Glass, or any other chemically inert layer to protect the wafers surface. In an iron implantation method, a suitable mask is placed in contact with the front surface of the semiconductor wafer. In some embodiments, the wafer may be implanted through both the front surface and the back surface of the wafer. The mask exposes a region of the front surface of the wafer to implanted iron ions. The size and shape of the exposed region is determined by the mask. In some embodiments, after a first implantation, the mask is removed and placed on a different location on the front surface of the semiconductor wafer, thereby exposing a different region of the front surface of the wafer to implanted iron ions. According to some embodiments, the iron is implanted through at least two different regions of the front surface of the semiconductor at different iron implantation densities. In some embodiments, the masking and iron implantation may be repeated to expose three or more, such as four or more, or five or more regions to several different iron implantation densities. For example, if three or more different regions are exposed to iron implantation, preferably, the iron implantation density is different at each of the three or more different regions. In this manner, a single wafer may serve as an internal calibration standard for measuring iron contamination.

In some embodiments, the iron ion implantation method may involve placing the mask over the wafer substrate such that a portion of an area of the wafer that has already been implanted is subjected to yet another ion implant. In this regard, overlapping implanted areas yield new implanted level as a superposition of two or more implanted levels.

In some embodiments, both the front surface of the wafer and the back surface of the wafer may be subjected to ion implantation in order to control the distribution of the implanted species across the wafer surface and bulk. In some embodiments, the surface area of ion implantation defined by the mask through both the front surface of the wafer and through the back surface of the wafer may correlate to control the implanted species distribution across the wafer. For example, the region(s) of ion implantation through the front surface may be identical to the region(s) of ion implantation through the back surface. That is, a map of at least one, two, three, four, or even five regions of ion implantation is formed on the front surface of the wafer, which is exactly replicated on the back surface of the wafer. In other embodiments, the surface area of ion implantation defined by the mask through both the front surface of the wafer and through the back surface of the wafer may do not correlate to control the implanted species distribution across the wafer. For example, the region(s) of ion implantation through the front surface may be different from the region(s) of ion implantation through the back surface. That is, the map of ion implantation on the front surface differs from a map of ion implantation on the back surface. By making the ion implantation regions identical or different across the front surface and the back surface of the wafer, a wide variety of ion implantation distributions through the wafer surfaces and in the bulk regions of the wafer are possible.

In some embodiments, iron may be introduced through the surface of the wafer by deposition from chemical solution, by gas phase deposition, by chemical vapor deposition, or by thermal in-diffusion from gas phase or solid state sources. In some embodiments, iron ions may be implanted through the front surface of the semiconductor wafer using a commercially available tool suitable for iron implantation. Suitable tools currently available include the PURION M (available from Axcelis Technologies, Beverly, Mass.), Varian VIISta (Trident, 900XP, or 900 3D, available from Applied Materials, Santa Clara, Calif.), or the Quantum X Implanter (available from Applied Materials, Santa Clara, Calif.), among others. Implantation of iron ions sputtered from a pure iron target may occur at an implantation energy between about 5 keV and bout 500 keV. In general, the iron ions derived from the pure iron target are $Fe^+$ although the valence may vary to include any of the possible iron valences, e.g., $Fe^{2+}$. In some embodiments, iron implantation occurs in a vacuum. In some embodiments, iron may be co-implanted with a gas fed into the implantation tool. Iron implantation may occur at different tilt angles from 0° C. to 60° C. (e.g., 0° C., 15° C., 30° C., 45° C., 60° C.) to reduce excessive generation of defects during iron implantation.

Iron ion may be implanted at an implantation density between about $1\times10^8$ atoms/cm$^2$ and about $1\times10^{13}$ atoms/cm$^2$. In some embodiments, a relatively thick oxide layer enables selection of very low iron implantation densities since the bulk of the iron implanted may be contained within the oxide layer, with a low percentage reaching the semiconductor wafer. A wafer having a thick oxide enables effective iron implantation densities in some regions of the wafer to be reached below the implantation tool control limits, such as below $1\times10^9$ ions/cm$^2$, or even below $1\times10^8$ ions/cm$^2$. In some embodiments, the oxide layer is stripped during post-implantation cleaning.

As stated above, the iron implantation density varies in separate regions of the wafer, each wafer being defined by the contours of the mask. For example, in some embodiments, iron implantation in a first region defined by the mask may occur at a first iron implantation density between about $1\times10^8$ atoms/cm$^2$ and bout $1\times10^{10}$ atoms/cm$^2$, while iron implantation may occur in a second, different region defined by the mask at a second, different iron implantation density between about $5\times10^{08}$ atoms/cm$^2$ and bout $1\times10^{13}$ atoms/cm$^2$. In some embodiments, iron implantation in a first region defined by the mask may occur at a first iron implantation density between about $1\times10^8$ atoms/cm$^2$ and about $1\times10^{10}$ atoms/cm$^2$, while iron implantation may occur in a second, different region defined by the mask at a second, different iron implantation density between about $1\times10^{10}$ atoms/cm$^2$ and about $1\times10^{13}$ atoms/cm$^2$. In some embodiments, iron implantation in a first region defined by the mask may occur at a first iron implantation density between about $1\times10^8$ atoms/cm$^2$ and bout $8\times10^9$ atoms/cm$^2$, while iron implantation may occur in a second, different region defined by the mask at a second, different iron implantation density between about $1\times10^{09}$ atoms/cm$^2$ and bout $1\times10^{13}$ atoms/cm$^2$. In some embodiments, iron implantation in a first region defined by the mask may occur at a first iron implantation density between about $1\times10^8$ atoms/cm$^2$ and bout $8\times10^9$ atoms/cm$^2$, while iron implantation may occur in a second, different region defined by the mask at a second, different iron implantation density between about $2\times10^{10}$ atoms/cm$^2$ and bout $1\times10^{13}$ atoms/cm$^2$. In some embodiments, iron ions may be implanted at a third iron implantation density into a third region of the wafer surface, a fourth iron implantation density into a fourth region of the wafer surface, and so on, such that each iron implantation density into each surface region of the wafer is different than the iron implantation densities into other regions of the wafer. In this manner, a single wafer may comprise multiple regions of different iron ion implantation densities, and the single wafer may be used as a calibration standard for several evaluation techniques, for example, the measurement of iron contamination in a silicon wafer.

In some embodiments, iron may be co-implanted with a second metal selected among copper, nickel, chromium, molybdenum, aluminum, and any combination thereof. Co-implantation could be performed as the separate implantation step using the related source different from Fe. The co-implanted metal ion implantation density may also vary from region to region in order to prepare a single wafer for use as a calibration standard for evaluation of contamination of the co-implanted metal.

In some embodiments, iron may be co-implanted with a non-metal selected from among hydrogen, oxygen, argon, helium, silicon, germanium, boron, phosphorus, arsenic, antimony and any combination thereof. Co-implantation could be performed as the separate implantation step using the related source different from Fe. Co-implantation with a non-metal may be performed by feeding a gas, e.g., hydrogen, oxygen, water, helium, boranes, into the implantation tool. As stated above, ion implantation through both the front surface and the back surface is possible. In some embodiments, therefore, the species implanted through the front surface of the wafer and the back surface of the wafer may be identical. For example, iron and germanium may be implanted through both the front surface and the back surface of the wafer. In some embodiments, the ion implantation densities and the regions of ion implantation through the front and back surfaces may be identical. In some embodiments, the ion implantation densities and the regions of ion implantation through the front and back surfaces may differ. In some embodiments, therefore, the species implanted through the front surface of the wafer and the back surface of the wafer may be different. For example, iron and germanium may be implanted through the front surface and the back surface of the wafer, while iron and boron may be implanted through the back surface of the wafer. Many different combinations of ions for implantation and regions for implantation are possible such that a wide variety of ion distributions in the bulk region of the wafer are possible.

After implantation of iron ions into the desired number of surface regions, and optionally through the front surface and the back surface of the wafer, at different iron ion implantation densities, the implanted wafer is subjected to an anneal at a temperature and duration sufficient to diffuse implanted iron into the bulk region of the semiconductor wafer. The anneal for the implanted iron drives-in and redistributes iron from the implanted areas and into the bulk region. The iron-implanted wafers may be annealed in a furnace or a rapid thermal anneal tool at temperatures within the range between about 300° C. and about 1300° C. In some embodiments, the thermal treatment is implemented using the low thermal budget, forming the non-equilibrium implanted species profile across the wafers, to enable the different conditions form the front side and from the back side. The iron implanted wafers may be loaded into to the vertical or horizontal furnace at load temperature between about 20° C. and about 750° C., similar thermal conditions as for the fast diffusing elements implemented for Low Temperature Out Diffusion (LTOD) type of treatment. The wafers may be heated in the furnace to reach the anneal temperature using the temperature ramps between about 0.5° C./min and about 100° C./min, such as between about 0.5° C./min and about 100° C./min to the desired anneal temperature between about 300° C. and about 1300° C., such as between about 700° C. and about 1100° C., or between about 800° C. and about 1000° C. In some embodiments, anneal may occur under vacuum. In some embodiments, the ambient atmosphere during annealing may comprise a gas selected from among oxygen, nitrogen, argon, steam, hydrogen, helium, $N_2O$, and any combination thereof. The anneal ambient atmosphere is selected to obtain the required surface termination such as an oxide or nitride layer, and/or a near surface layer devoid of oxygen precipitates (i.e., a denuded zone).

A semiconductor wafer prepared according to the method of the present invention having multiple regions of different and known iron ion concentrations is useful as calibration standard for a variety of wafer evaluation techniques. The wafer is useful for tool calibration for surface photovoltage Fe measurement. The wafer is useful for the determination of tool stability over time (Statistical Process Control). The wafer is useful for the determination of tool linearity, or lack thereof, in measuring bulk Fe. The wafer is useful for determining alignment and correlation among SPV tools (tool matching). The wafers are useful for determining the impact of metals contamination on the material properties of silicon wafers and devices built therein.

EXAMPLES

The following non-limiting examples are provided to further illustrate the present invention.

Example 1. Iron Implanted Silicon Wafers

Measurements were made on boron-doped, 125 mm in diameter and 0.5 mm thick bare CZ silicon wafers with a resistivity of 20 Ωcm ([B]=$10^{15}$ atoms/cm$^3$) with low concentrations of interstitial oxygen atoms ([$O_i$]<$5\times10^{17}$ atoms/cm3). Iron was implanted at following doses $N_{Di}$=$2\times10^9$ atoms/cm$^2$, $5\times10^9$ atoms/cm$^2$, $2\times10^{10}$ atoms/cm$^2$, and $2\times10^{11}$ atoms/cm$^2$. Ion implantation followed the template depicted in FIG. 1. The implantation energy was E=50 keV. After implantation, the wafers were wet chemically cleaned including (a) Piranha etch at 120° C., (b) HCl etch at 80° C., and (c) standard SC-1 and SC-2 solutions, followed by intensive deionized water (DIW) rinse. The wafers were RTA annealed in an oxygen ambient at temperatures from 375 to 1100° C. with temperature ramps of 50° C./s.

Figure 2:
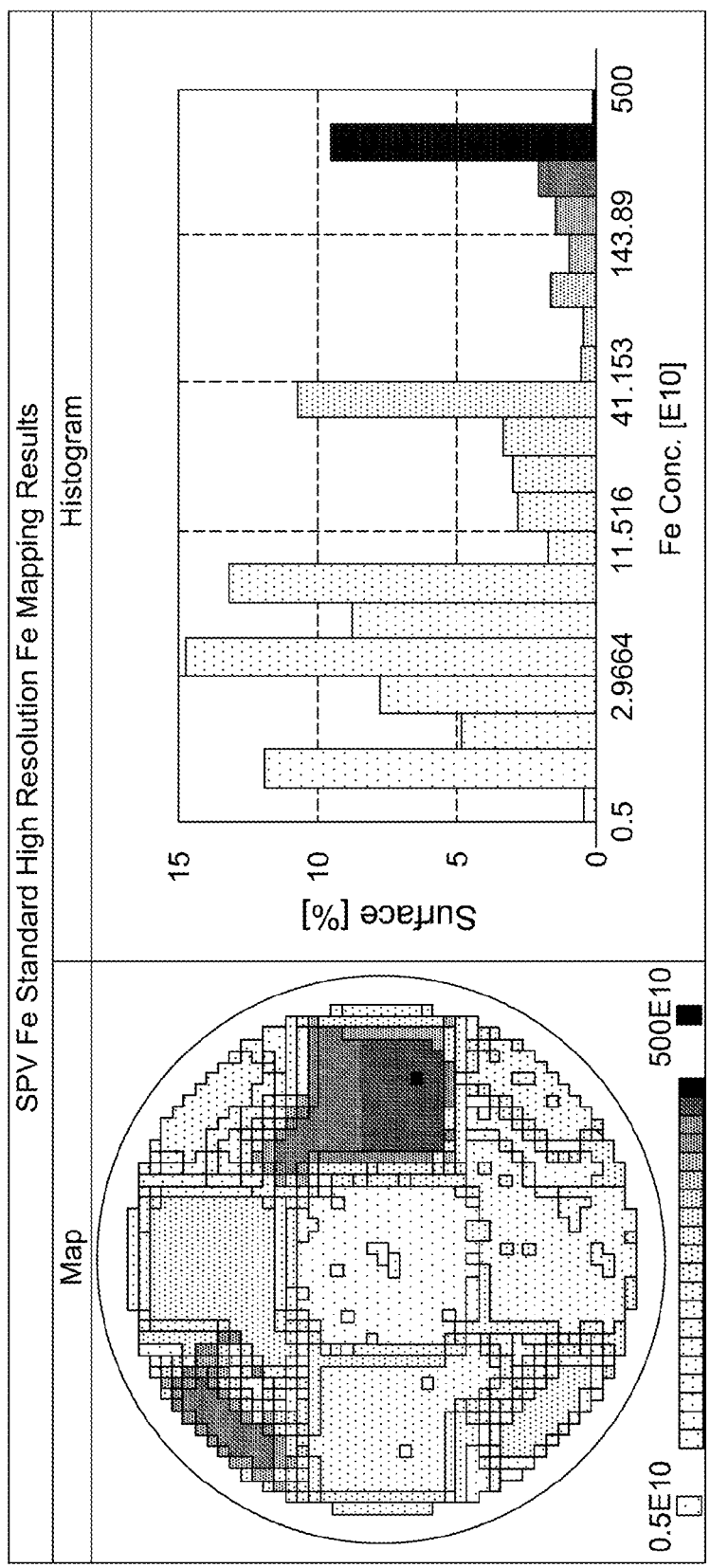
FIG. 2 a high resolution depiction of surface photovoltage iron mapping of a wafer prepared according to the method of the present invention.

The SPV preparation procedure included the oven anneal at 80° C. for at least 30 min to facilitate the FeB pair formation. The wafers were evaluated by measuring SPV. See FIG. 2, which is a high resolution depiction of surface photovoltage iron mapping of a wafer prepared using the template depicted in FIG. 1.

Example 2. Iron Implantation Uniformity Across a Batch of Wafers

Figure 3:
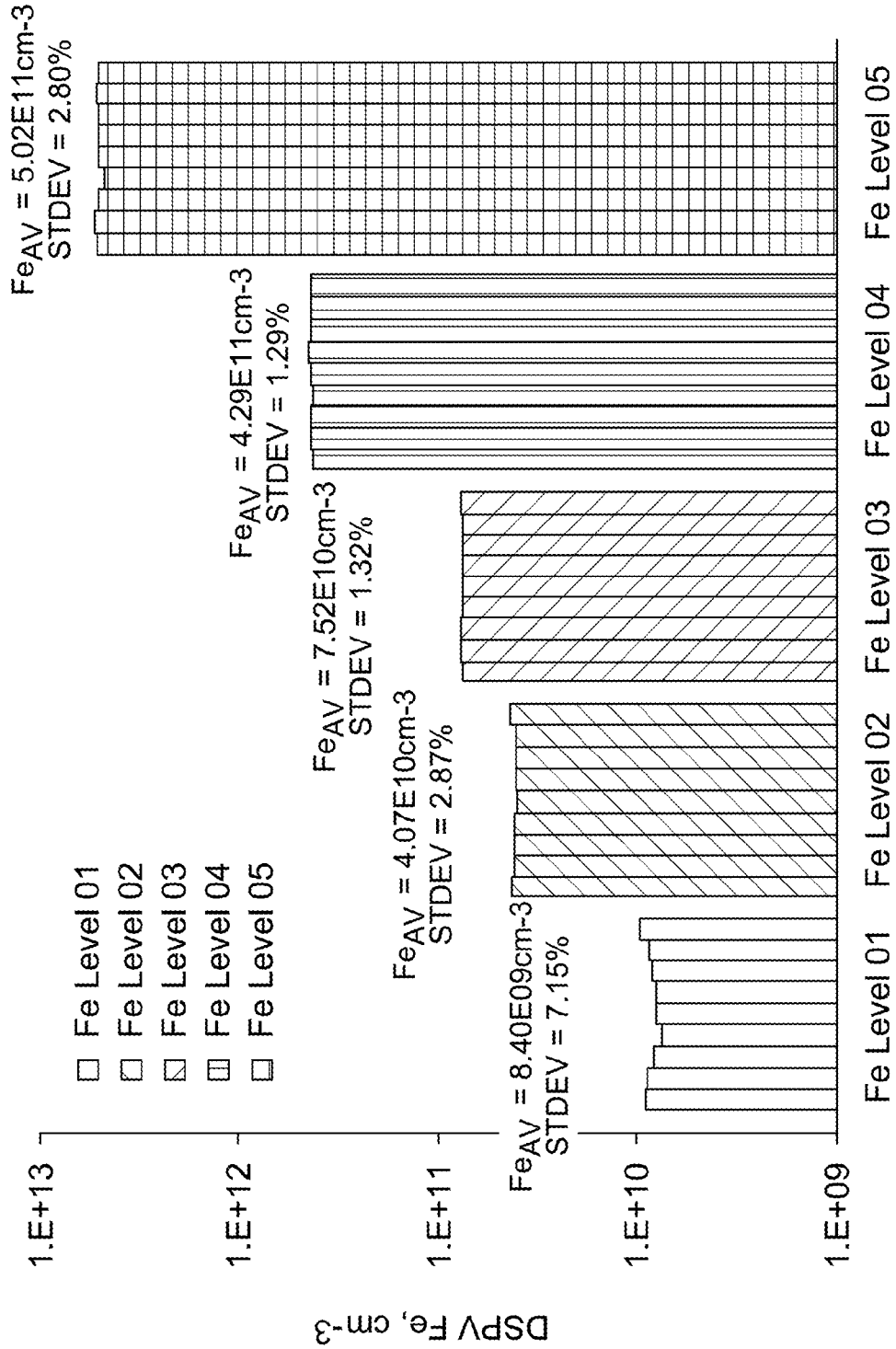
FIG. 3 is a chart depicting uniformity of the implanted iron concentration within each region across a batch of nine wafers prepared according to the method of the present invention.

Batches of wafers were prepared in the manner described in Example 1. The iron density was determined for each wafer within the batch. See FIG. 3, which is a chart depicting uniformity of the implanted iron concentration within each region across a batch of nine wafers.

Example 3. Iron Implantation Repeatability Over Time

Figure 4:
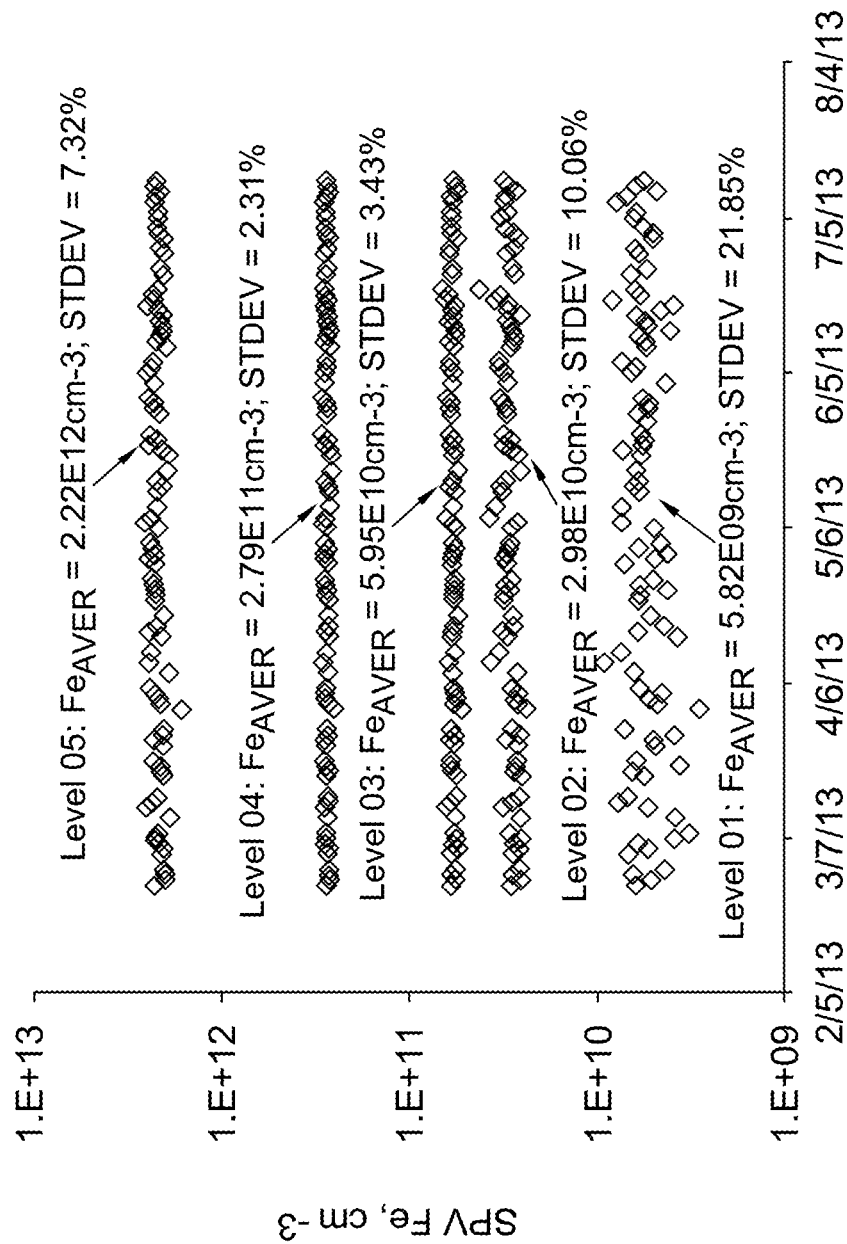
FIG. 4 is a chart depicting iron concentration measured repeatability within each region within a wafer prepared according to the method of the present invention.

Implanted iron within wafer concentration repeatability over time was measured in an iron implanted wafer. Wafers were prepared in the manner described in Example 1. The iron density was measured over each of the five implanted regions with the wafer over the course of five months. See FIG. 4, which is a chart depicting iron concentration repeatability within each region within the wafer.

Example 4. SPV Fe vs. DLTS Fe Correlation

Figure 5:
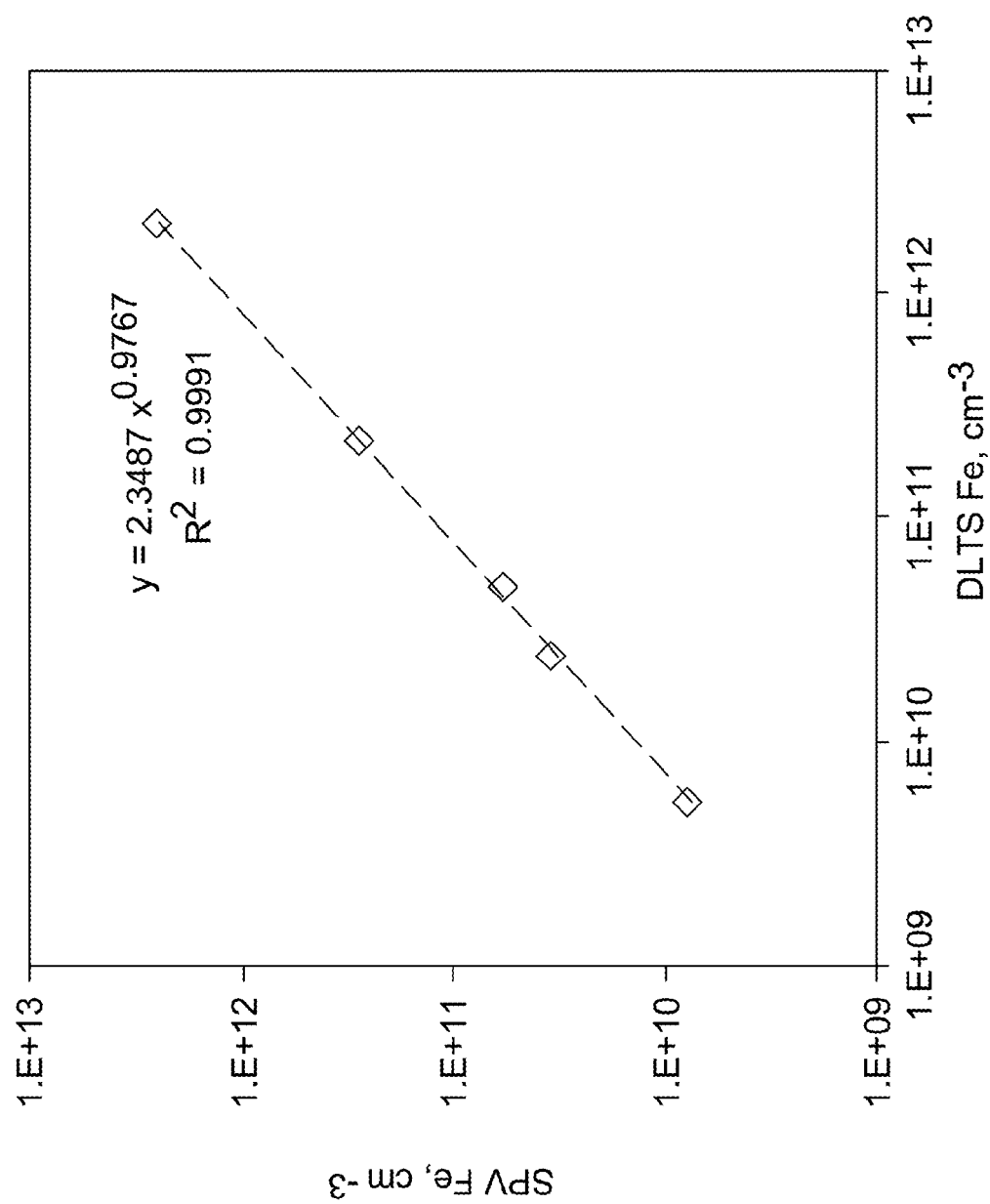
FIG. 5 is a graph showing high correlation of iron concentration measurements by both surface photovoltage (SPV) and deep-level transient spectroscopy (DLTS).

Implanted iron concentrations over five regions in a wafer were measured by surface photovoltage (SPV) and deep-level transient spectroscopy (DLTS). Wafers were prepared in the manner described in Example 1. As can be seen from FIG. 5, each method provides similar iron concentration measurements with high correlation ($R^2$=0.9991).

When introducing elements of the present invention or the preferred embodiments(s) thereof, the articles "a", "an", "the" and "said" are intended to mean that there are one or more of the elements. The terms "comprising", "including" and "having" are intended to be inclusive and mean that there may be additional elements other than the listed elements.

In view of the above, it will be seen that the several objects of the invention are achieved and other advantageous results attained.

As various changes could be made in the above products and methods without departing from the scope of the invention, it is intended that all matter contained in the above description and shown in the accompanying drawings shall be interpreted as illustrative and not in a limiting sense.

What is claimed is:

1. A method of preparing an iron-implanted semiconductor wafer for use in surface photovoltage iron mapping, the method comprising:
   implanting iron through at least two different regions of a front surface of the semiconductor wafer, wherein the semiconductor wafer comprises the front surface, the back surface, a circumferential edge connecting the front and back surfaces, and a bulk region between the front surface and the back surface of the semiconductor wafer, and further wherein the iron is implanted through the at least two different regions of the front surface of the semiconductor at different iron implantation densities; and
   annealing the iron-implanted semiconductor wafer at a temperature and duration sufficient to diffuse implanted iron into the bulk region of the semiconductor wafer.

2. The method of claim 1 wherein the semiconductor wafer comprises a semiconductor material selected from the group consisting of silicon, germanium, gallium, arsenic, and any combination thereof.

3. The method of claim 1 wherein the semiconductor wafer is selected from the group consisting of silicon wafer, germanium wafer, gallium arsenide wafer, polycrystalline silicon wafer, silicon germanium wafer, silicon on insulator wafer, silicon germanium on insulator wafer, and epitaxial silicon wafer.

4. The method of claim 1 wherein the semiconductor wafer comprises an oxide layer on the front surface thereof, the oxide layer having a thickness between about 1 nanometer to about 1000 nanometers.

5. The method of claim 1 wherein the semiconductor wafer comprises the oxide layer on the front surface thereof prior to iron implantation, and the method further comprises the step of removing the oxide layer after iron implantation.

6. The method of claim 1 wherein the front surface of the semiconductor wafer comprises a material selected from the group consisting of silicon oxide, aluminum oxide, germanium oxide, and silicon nitride.

7. The method of claim 1 wherein the semiconductor wafer comprises an electrically active dopant selected from the group consisting of boron, aluminum, phosphorus, arsenic, and antimony.

8. The method of claim 1 wherein the semiconductor wafer comprises oxygen in a concentration between about 4 PPMA (ASTM standard) and about 18 PPMA (ASTM standard).

9. The method of claim 1 wherein the semiconductor wafer comprises oxygen in a concentration between about 10 PPMA (ASTM standard) and about 35 PPMA (ASTM standard).

10. The method of claim 1 wherein the front surface of the semiconductor wafer is polished prior to iron implantation.

11. The method of claim 1 wherein the iron is implanted at an implantation energy between about 5 keV and about 500 keV.

12. The method of claim 1 wherein the iron is implanted at an implantation density between about $1\times10^8$ atoms/cm$^2$ and bout $1\times10^{13}$ atoms/cm$^2$.

13. The method of claim 1 wherein implanting iron comprises the steps of:
    (a) applying a mask to the front surface of the semiconductor wafer, wherein the mask exposes a first pre-determined region of the front surface of the semiconductor wafer through which iron is implanted;
    (b) implanting iron at a first iron implantation density through the first pre-determined region;
    (c) removing the mask;
    (d) applying the mask to the front surface of the semiconductor wafer to thereby expose a second pre-determined region of the front surface of the semiconductor wafer through which iron is implanted;
    (e) implanting iron at a second iron implantation density through the second pre-determined region, wherein the second pre-determined region of the front surface of the semiconductor wafer is non-overlapping with first pre-determined region, and the second iron implantation density is different from the first iron implantation density.

14. The method of claim 13 wherein the first iron implantation density is between about $1\times10^8$ atoms/cm$^2$ and bout $1\times10^{10}$ atoms/cm$^2$, and the second iron implantation density is between about $5\times10^8$ atoms/cm$^2$ and bout $1\times10^{13}$ atoms/cm$^2$.

15. The method of claim 13 wherein the first iron implantation density is between about $1\times10^8$ atoms/cm$^2$ and bout $8\times10^9$ atoms/cm$^2$, and the second iron implantation density is between about $1\times10^9$ atoms/cm$^2$ and bout $1\times10^{13}$ atoms/cm$^2$.

16. The method of claim 13 wherein iron is implanted into a third pre-determined region of the front surface of the semiconductor wafer at a third iron implantation density, wherein the third pre-determined region of the front surface of the semiconductor wafer is non-overlapping with first and second pre-determined regions, and the third iron implantation density is different from the first and second iron implantation densities.

17. The method of claim 1 wherein the iron is introduced by deposition from chemical solution, by gas phase deposition, by chemical vapor deposition, or by thermal in-diffusion from gas phase or solid state sources.

18. The method of claim 1 wherein iron is co-implanted with a second metal selected from the group consisting of copper, nickel, chromium, molybdenum, aluminum, and any combination thereof.

19. The method of claim 1 wherein iron is co-implanted with a non-metal selected from the group consisting of hydrogen, oxygen, argon, helium, silicon, germanium, boron, phosphorus, arsenic, antimony, and any combination thereof.

20. The method of claim 1 wherein iron is co-implanted with a non-metal selected from the group consisting of hydrogen, oxygen, argon, helium, silicon, germanium, and any combination thereof.

21. The method of claim 1 wherein the iron-implanted semiconductor wafer is annealed at a temperature between about 300° C. and about 1300° C.

22. The method of claim 21 wherein the ambient atmosphere during annealing comprises a gas selected from the group consisting of oxygen, nitrogen, argon, steam, hydrogen, helium, $N_2O$, and any combination thereof.

23. The method of claim 21 wherein the annealing occurs under vacuum.

24. The method of claim 1 wherein the implantation mask is made of Aluminum, of Stainless Steel, of Glass, of Silicon, or any other material and/or combination of materials.

25. The method of claim 1 wherein implantation mask is covered by Teflon, or by Polymer, or by Glass, or any other inert material to protect the implanted wafer from mechanical damage and/or metals cross-contamination.

26. The method of claim 1 where the ion implantation is made through the photoresist mask formed using the conventional contact or projection Photolithography process, including the Photoresist coat, Photolithography mask introduction, Photoresist exposure, Photoresist hardening and etch.

27. The method of claim 1 further comprising placing the mask over the wafer substrate such that a portion of an area of the wafer that has already been implanted is subjected to another iron ion implant.

28. The method of claim 1 further comprising implanted iron through the front surface of the wafer and the back surface of the wafer to control the implanted species distribution across the wafer surfaces and bulk region.

29. The method of claim 28 wherein the implanted areas shape and position from the front side and from the back side correlate to control the implanted species distribution across the wafer.

30. The method of claim 28 wherein the implanted areas shape and position from the front side and from the back side do not correlate to control the implanted species distribution across the wafer.

31. The method of claim 28 wherein the implanted species kind/type/elements from the front side and from the back side are the same.

32. The method of claim 28 wherein the implanted species kind/type/elements from the front side and from the back side are different.

33. The method of claim 1 where thermal treatment is implemented using the low thermal budget, forming the non-equilibrium implanted species profile across the wafers, to enable the different conditions form the front side and from the back side.

34. The method of claim 1 where the implanted species distribution is made at temperature from about 20° C. to about 750° C., similar thermal conditions as for the fast diffusing elements implemented for LTOD type of treatment.

35. An iron-implanted semiconductor wafer for use in surface photovoltage iron mapping prepared by the method of claim 1.

36. An iron-implanted semiconductor wafer for use in surface photovoltage iron mapping, the iron-implanted semiconductor wafer comprising a front surface, a back surface, a circumferential edge connecting the front and back surfaces, and a bulk region between the front surface and the back surface of the semiconductor wafer, and further wherein the bulk region of the wafer comprises at least two different iron implantation densities.

* * * * *